(12) United States Patent
Gulbahar et al.

(10) Patent No.: US 10,951,311 B2
(45) Date of Patent: Mar. 16, 2021

(54) VISIBLE LIGHT COMMUNICATION USING COLOUR SHIFT KEYING

(71) Applicant: VESTEL ELEKTRONIK SANAYI VE TICARET A.S., Manisa (TR)

(72) Inventors: Burhan Gulbahar, Manisa (TR); Gorkem Memisoglu, Manisa (TR)

(73) Assignees: VESTEL ELEKTRONIK SANAYI VE TICARET A.S., Manisa (TR); OZYEGIN UNIVERSITESI, Istanbul (TR)

( * ) Notice: Subject to any disclaimer, the term of this patent is extended or adjusted under 35 U.S.C. 154(b) by 0 days.

(21) Appl. No.: 16/473,097

(22) PCT Filed: Dec. 22, 2017

(86) PCT No.: PCT/EP2017/084469
§ 371 (c)(1),
(2) Date: Jun. 24, 2019

(87) PCT Pub. No.: WO2018/115483
PCT Pub. Date: Jun. 28, 2018

(65) Prior Publication Data
US 2019/0349084 A1     Nov. 14, 2019

(30) Foreign Application Priority Data
Dec. 23, 2016    (EP) .................................... 16206756

(51) Int. Cl.
*H04B 10/116*    (2013.01)
*H04B 10/50*    (2013.01)
(Continued)

(52) U.S. Cl.
CPC ......... *H04B 10/116* (2013.01); *H04B 10/501* (2013.01); *H04B 10/572* (2013.01); *H04B 10/67* (2013.01)

(58) Field of Classification Search
CPC .... H04B 10/501; H04B 10/572; H04B 10/67; H04B 10/116; H01L 25/0753
(Continued)

(56) References Cited

U.S. PATENT DOCUMENTS

| 10,050,715 B1* | 8/2018 | Blanks | ................. G01J 3/0229 |
| 2012/0205518 A1* | 8/2012 | Voutilainen | ............... G01J 1/42 |
| | | | 250/200 |

(Continued)

FOREIGN PATENT DOCUMENTS

| WO | 2012/097885 A1 | 7/2012 | |
| WO | WO-2012097885 A1 * | 7/2012 | ............. H03M 7/16 |
| WO | 2012/123572 A1 | 9/2012 | |

OTHER PUBLICATIONS

Singh et al; An enhanced color shift keying modulation scheme for high speed wireless visible light communications; IEEE; Jul. 2014; pp. 2582-2592. (Year: 2014).*

(Continued)

*Primary Examiner* — Amritbir K Sandhu
(74) *Attorney, Agent, or Firm* — Brooks Kushman P.C.

(57) ABSTRACT

The present disclosure provides a visible light communication transmitter, a visible light communication receiver, a visible light communication system, and a method of visible light communication, which are suitable for colour shift keying (CSK), as well as providing a method of CSK. The transmitter comprises at least six graphene-based light emitting devices of different peak transmission wavelengths from each other. The receiver comprises a corresponding number of graphene-based photodetectors of different peak reception wavelengths from each other. A system according to the disclosure comprises such a transmitter and such a receiver, wherein each respective one of the different peak reception wavelengths of the six graphene-based photodetectors corresponds to a respective one of the different peak (Continued)

transmission wavelengths of the graphene-based light emitting devices. Such a system allows a method of visible light communication with a colour constellation of at least six base colours.

12 Claims, 3 Drawing Sheets

(51) Int. Cl.
*H04B 10/572* (2013.01)
*H04B 10/67* (2013.01)

(58) Field of Classification Search
USPC .................................................. 398/118–131
See application file for complete search history.

(56) References Cited

U.S. PATENT DOCUMENTS

| | | | | |
|---|---|---|---|---|
| 2013/0214252 | A1* | 8/2013 | Park | H01L 21/02527 257/29 |
| 2014/0070170 | A1* | 3/2014 | Andersson | G01N 27/4146 257/29 |
| 2014/0299741 | A1* | 10/2014 | Colli | H01L 31/035218 250/200 |
| 2016/0005894 | A1* | 1/2016 | Zhang | H01L 31/1804 257/29 |
| 2016/0172527 | A1* | 6/2016 | Beechem, III | H01L 31/0232 257/294 |
| 2016/0190257 | A1* | 6/2016 | Tzeng | H01L 29/1606 250/208.2 |
| 2017/0102358 | A1* | 4/2017 | Hoffman | H01L 21/76879 |
| 2017/0250304 | A1* | 8/2017 | Choi | H01L 31/03529 |
| 2017/0256679 | A1* | 9/2017 | Fan | G09G 5/02 |
| 2017/0350882 | A1* | 12/2017 | Lin | A61B 5/6821 |
| 2017/0352492 | A1* | 12/2017 | Tang | G01J 1/44 |
| 2018/0047856 | A1* | 2/2018 | Cai | H01L 31/1804 |

OTHER PUBLICATIONS

Wang et al; A spectrally tunable all-graphene based flexible field effect light emitting device; Nature communications; Apr. 2015; pp. 1-6. (Year: 2015).*
Drost et al; Constellation design for channel pre compensation in multi wavelength visible light communications; IEEE; Jun. 2014; pp. 1195-2005. (Year: 2014).*
Liu et al; Graphene photo detectors with ultra-broadband and high responsivity at room temperature; Nature nanotechnology; Apr. 2014; pp. 273-278 (Year: 2014).*
Liu et al; Plasmon resonance enhanced multi color photodetection by graphene; Nature communications; Dec. 2011; pp. 1-7. (Year: 2011).*
Liu et al; Graphene photodetectors with ultra-broadband and high responsivity at room temperature; nature nanotechnology; Mar. 2014; pp. 273-278 (Year: 2014).*
Lee et al; Flexible and transparent all-graphene circuits for quaternary digital modulations; nature communications, Aug. 2012; pp. 1-7. (Year: 2012).*
Ravinder Singh et al., "An Enhanced Color Shift Keying Modulation Scheme for High-Speed Wireless Visible Light Communications", Journal of Lightwave Technlogy, vol. 32., No. 14, Jul. 15, 2014, XP-002770985, pp. 2582-2592.
Xiaomu Wang et al., "A spectrally tunable all-graphene-based flexible field-effect light-emitting device", Nature Communications, vol. 6, Published Jul. 16, 2015, XP-55380336, 6 Pages.
Yuan Liu et al., "Plasmon resonance enhanced multicolour photodetection by graphene", Nature Communications, vol. 2, Published Dec. 6, 2011, XP-55249772, 7 Pages.
Chang-Hua Liu et al., "Graphene photodetectors with ultra-broadband and high responsivity at room temperature", Nature Nanotechnology, vol. 9, Published Online Mar. 16, 2014, XP-55380339, pp. 273-278.
Robert J. Drost et al., "Constellation Design for Channel Precompensation in Multi-Wavelength Visible Light Communications", IEEE Transactions on Communications, vol. 62, No. 6, Jun. 2014, pp. 1995-2005.
PCT Written Opinion of the International Searching Authority and International Search Report Dated Sep. 3, 2018, Application No. PCT/EP2017/084469, Applicant Vestel Elektronik Sanayi Ve Ticaret A S, 12 Pages.

* cited by examiner

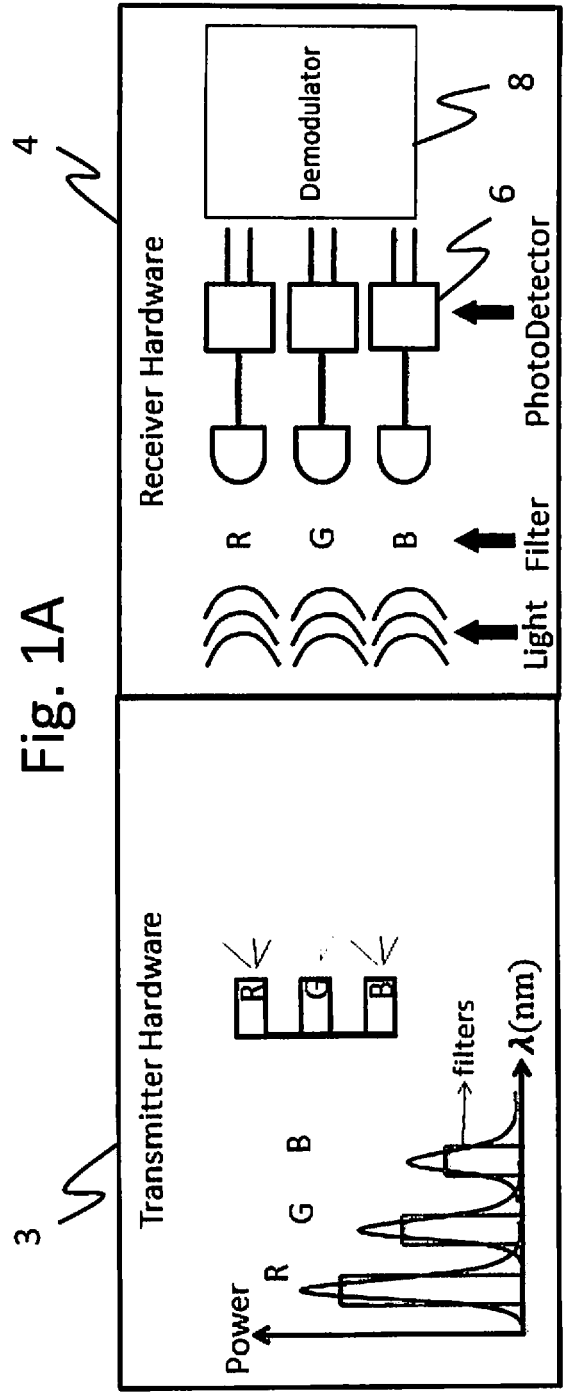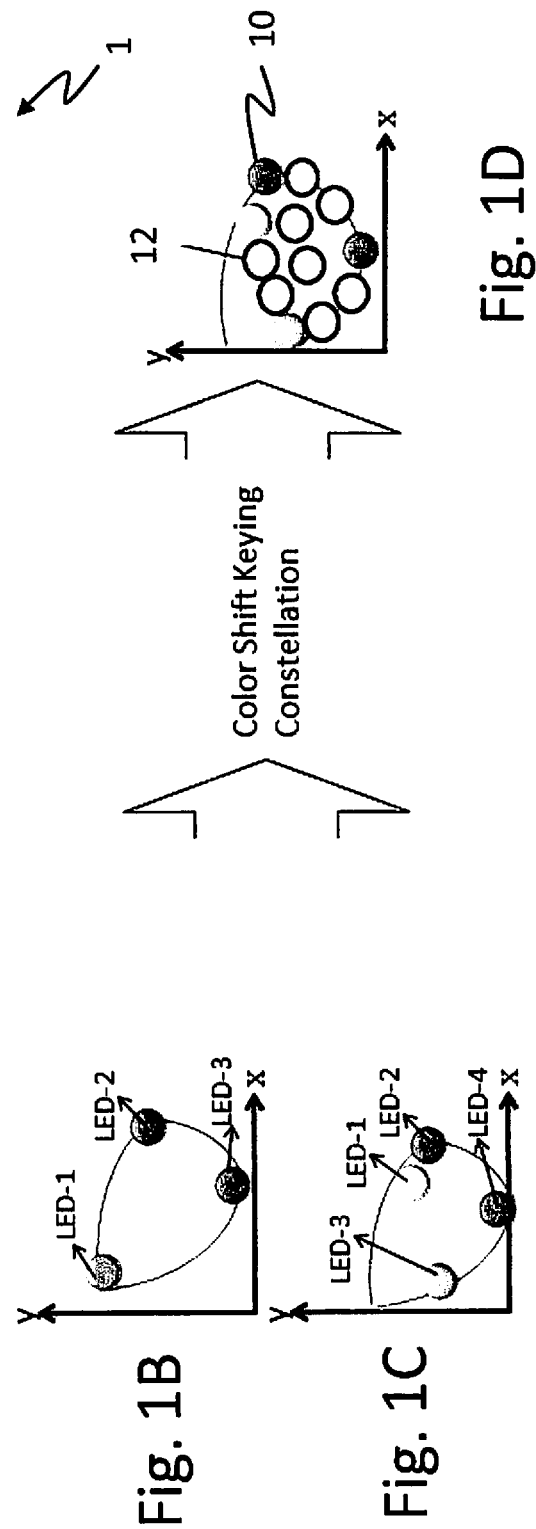

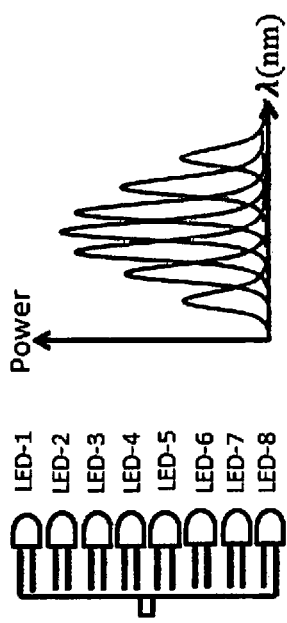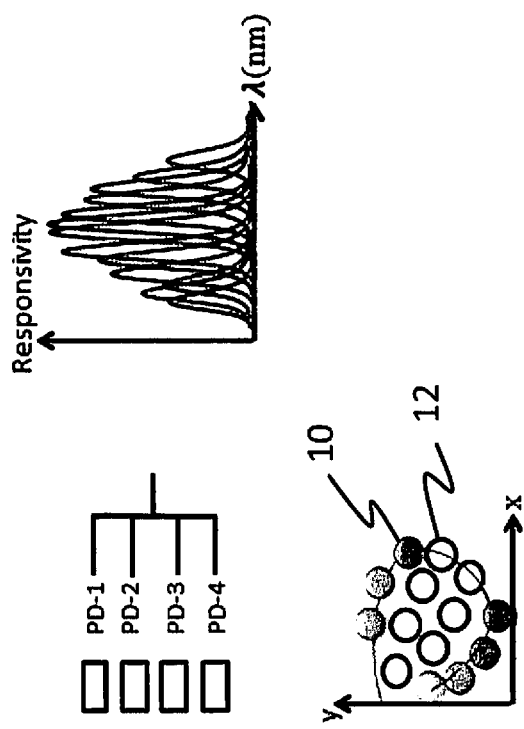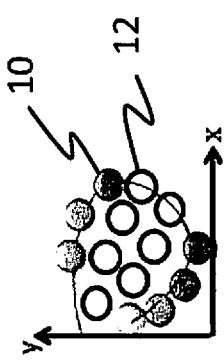
Fig. 3A
Fig. 3B
Fig. 3C

VISIBLE LIGHT COMMUNICATION USING COLOUR SHIFT KEYING

CROSS-REFERENCE TO RELATED APPLICATIONS

This application is the U.S. national phase of PCT Application No. PCT/EP2017/084469 filed on Dec. 22, 2017, which claims priority to European Patent Application No. EP 16206756.5 filed on Dec. 23, 2016, the disclosures of which are incorporated in their entireties by reference herein.

TECHNICAL FIELD

The present disclosure relates to a visible light communication transmitter, a visible light communication receiver, a visible light communication system, a method of visible light communication, and a method of colour shift keying.

BACKGROUND

It is known to communicate information using visible light by encoding the information using a constellation of different colours. This is known as colour shift keying (CSK). Prior art systems may use a colour constellation of three or four base colours. Such a system may be embodied using differently coloured LEDs, which may be three in number, in which case the system is known as a tri-LED or T-LED system, or four in number, in which case the system is known as a quad-LED or Q-LED system. For example, WO 2012/097885 describes a coding scheme and method for a colour-shift keying constellation in a visible-light communication system. WO 2012/123572 describes a method and device for notification in a system for visible light communication. "An Enhanced Colour Shift Keying Modulation Scheme for High-Speed Wireless Visible Light Communications" by R. Singh, T. O'Farrell and J. P. R. David, *Journal of Lightwave Technology*, Vol. 32, no. 14, pp. 2582-2592 (2014) describes a quad-LED colour-shift keying constellation. According to these different CSK schemes, other colours are obtained by mixing the base colours.

However, using only three or four base colours results in power inefficiency, since a mixed colour is not generated directly by only a single LED, but instead requires the use of at least two LEDs. Furthermore, traditional photodetectors are generally able to receive visible light across a wide range of wavelengths. Photodetectors in traditional visible-light communication systems are therefore each provided with a colour filter which defines a waveband corresponding to one of the peak transmission wavelengths of the light emitted by a respective one of the LEDs.

Moreover, using only three or four base colours limits the range of different possible colour combinations which are available by mixing, and therefore correspondingly reduces the number of different symbols which can be represented by the colours using CSK.

"A spectrally tunable all-graphene-based flexible field-effect light-emitting device" by Xiaomu Wang, He Tian, Mohammad Ali Mohammad, Cheng Li, Can Wu, Yi Yang & Tian-Ling Ren, *Nature Communications*, Vol. 6, p. 7767 (2015), doi: 10.1038/ncomms8767, describes a tunable all-graphene-based light-emitting device.

"Plasmon resonance enhanced multicolour photodetection by graphene" by Yuan Liu, Rui Cheng, Lei Liao, Hailong Zhou, Jingwei Bai, Gang Liu, Lixin Liu, Yu Huang & Xiangfeng Duan, *Nature Communications*, Vol. 2, p. 579 (2011), doi: 10.1038/ncomms1589, describes a graphene-based photodetector.

"Graphene photodetectors with ultra-broadband and high responsivity at room temperature" by Chang-Hua Liu, You-Chia Chang, Theodore B. Norris & Zhaohui Zhong, *Nature Nanotechnology*, Vol. 9, pp. 273-278 (2014), doi:10.1038/nnano.2014.31, also describes a graphene-based photodetector.

SUMMARY

It is therefore an object of the disclosure to provide a visible light communication transmitter, a visible light communication receiver, a visible light communication system, and a method of visible light communication, wherein the transmitter, the receiver, the system and the method are suitable for colour shift keying (CSK), as well as to provide a method of colour shift keying.

The object of the disclosure is solved by a visible light communication transmitter. The visible light communication transmitter is suitable for colour shift keying and preferably at least comprises at least six graphene-based light emitting devices of different peak transmission wavelengths from each other.

As used herein, the term "visible light" refers to light having a wavelength of from about 350 to about 750 nanometres, and especially from about 390 to about 700 nanometres.

This solution is beneficial since the transmitter can be used for colour shift keying with a colour constellation of at least six, maybe seven, or even eight base colours. These can provide an increased number of symbols, a reduced symbol error rate and an improved signal-to-noise ratio in comparison to traditional methods of visible light communication using colour shift keying, which use a T-LED or Q-LED transmitter to give a colour constellation of only three or four base colours, respectively. Since some of the at least six base colours replace mixed colours in a prior art colour shift keying system, the graphene-based light emitting devices also have higher transmission power efficiency than traditional light emitting diodes.

Advantageous embodiments of the disclosure may be configured according to any claim and/or part of the following description.

At least one of the graphene-based light emitting devices may comprise a field effect light emitting diode. Preferably, each one of them comprises a field effect light emitting diode.

The peak transmission wavelength of at least one of the graphene-based light emitting devices may be tunable. Preferably, the peak transmission wavelengths of all of the graphene-based light emitting devices are tunable. This is beneficial because it allows the base colours of the CSK colour constellation to be chosen advantageously to optimize the symbol error rate and signal-to-noise ratio by tuning the peak transmission wavelengths.

Preferably, the transmitter further comprises at least one respective gate voltage tuner associated with the at least one of the graphene-based light emitting devices, the tuner being operable to tune the peak transmission wavelength of the respective graphene-based light emitting device.

Preferably, the transmitter further comprises a modulator operable to switch selected ones of the graphene-based light emitting devices on and off to encode information using colour shift keying. This is beneficial because it allows an electrical signal encoding information to be converted into visible light by the graphene-based light emitting devices, the visible light encoding the same information as the electrical signal using colour shift keying.

The present disclosure also relates to a visible light communication receiver according to claim 6. The visible light communication receiver is suitable for colour shift keying and preferably at least comprises at least six graphene-based photodetectors of different peak reception wavelengths from each other.

This solution is beneficial since the receiver can be used for colour shift keying with a colour constellation of at least six, maybe seven, or even eight base colours. These can provide an increased number of symbols, a reduced symbol error rate and an improved signal-to-noise ratio in comparison to traditional methods of visible light communication using colour shift keying, which use a receiver comprising traditional photodetectors to detect a colour constellation of only three or four base colours. Graphene-based photodetectors also provide better and more efficient detection than traditional photodetectors.

At least one of the graphene-based photodetectors may comprise a phototransistor at least comprising a pair of stacked graphene monolayers. Such phototransistors have a graphene double-layer heterostructure. Preferably, each of the graphene-based photodetectors comprises a phototransistor at least comprising a pair of stacked graphene monolayers. Such phototransistors are beneficial since they can provide very high levels of responsivity to visible light.

The peak reception wavelength of at least one of the graphene-based photodetectors may be adjustable. Preferably, the peak reception wavelengths of all of the graphene-based photodetectors are adjustable. This is beneficial because it allows the peak reception wavelengths of the graphene-based photodetectors to be adjusted to match the peak transmission wavelengths of a visible light communication transmitter.

Preferably, the receiver further comprises at least one respective tuner associated with the at least one of the graphene-based photodetectors. The tuner preferably comprises a plasmonic nanostructure having a plasmon resonance frequency configured to adjust the peak reception wavelength of the graphene-based photodetector.

Preferably, the receiver further comprises a demodulator operable to decode information encoded in an electrical signal output by the graphene-based photodetectors as a result of them receiving visible light in which the information was encoded using colour shift keying. This is beneficial because it allows the electrical signal to be decoded in order to recover the information encoded in the visible light using colour shift keying.

The present disclosure further relates to a visible light communication system. The visible light communication system is suitable for colour shift keying and preferably at least comprises a visible light communication transmitter as described above and a visible light communication receiver as described above. Each respective one of the different peak reception wavelengths of the at least six graphene-based photodetectors corresponds to a respective one of the different peak transmission wavelengths of the at least six graphene-based light emitting devices.

This solution is beneficial since the system can be used for colour shift keying with a colour constellation of at least six, maybe seven, or even eight base colours. These can provide greater power efficiency in both transmission and reception, an increased number of symbols, a reduced symbol error rate and an improved signal-to-noise ratio in comparison to traditional visible light communication systems for colour shift keying, which use a colour constellation of only three or four base colours.

The present disclosure also relates to a method of visible light communication. The method preferably at least comprises transmitting visible light of at least six different wavelengths from respective ones of at least six graphene-based light emitting devices, each of which has a respective peak transmission wavelength different from that of the other such devices, and receiving the visible light of at least six different wavelengths at respective ones of at least six graphene-based photodetectors, each of which has a respective peak reception wavelength corresponding to a respective one of the peak transmission wavelengths of the at least six graphene-based light emitting devices.

Preferably, the method further comprises modulating the visible light of at least six different wavelengths before its transmission using colour shift keying to encode information, and demodulating an electrical signal output by the graphene-based photodetectors to decode the information encoded in the visible light using colour shift keying and received by the graphene-based photodetectors.

Preferably, the method further comprises at least one of tuning the peak transmission wavelength of at least one of the graphene-based light emitting devices using gate voltage tuning, and adjusting the peak reception wavelength of at least one of the graphene-based photodetectors using a plasmonic nanostructure.

The present disclosure also relates to a method of colour shift keying at least comprising using a colour constellation of at least six, preferably seven, and more preferably eight, base colours.

The present disclosure further relates to a computer program product or a program code or system for executing one or more than one of the herein described methods.

Further features, goals and advantages of the present disclosure will now be described in association with the accompanying drawings, in which exemplary components of the disclosure are illustrated. Components of the devices and methods according to the disclosure, which are at least essentially equivalent to each other with respect to their function can be marked by the same reference numerals, wherein such components do not have to be marked or described in all of the drawings.

In the following description, the disclosure is described by way of example only with respect to the accompanying drawings.

BRIEF DESCRIPTION OF THE DRAWINGS

FIG. 1A schematically shows elements of a prior art visible light communication system for colour shift keying;

FIG. 1B is a CIE 1931 x-y chromaticity chart for a tri-LED colour constellation;

FIG. 1C is a CIE 1931 x-y chromaticity chart for a quad-LED colour constellation;

FIG. 1D is CIE 1931 x-y chromaticity chart schematically showing some examples of colours generated by mixing the quad-LED colour constellation of FIG. 1C;

FIG. 3A schematically shows elements of a visible light communication transmitter for colour shift keying, together with a graph schematically representing its associated power output;

FIG. 3B schematically shows elements of a visible light communication receiver for colour shift keying, together with a graph schematically representing its associated responsivity; and FIG. 3C is a CIE 1931 x-y chromaticity chart schematically showing an example of a colour constellation with eight basic colours for use in a method of colour shift keying using a visible light communication system.

DETAILED DESCRIPTION

Figure 2:
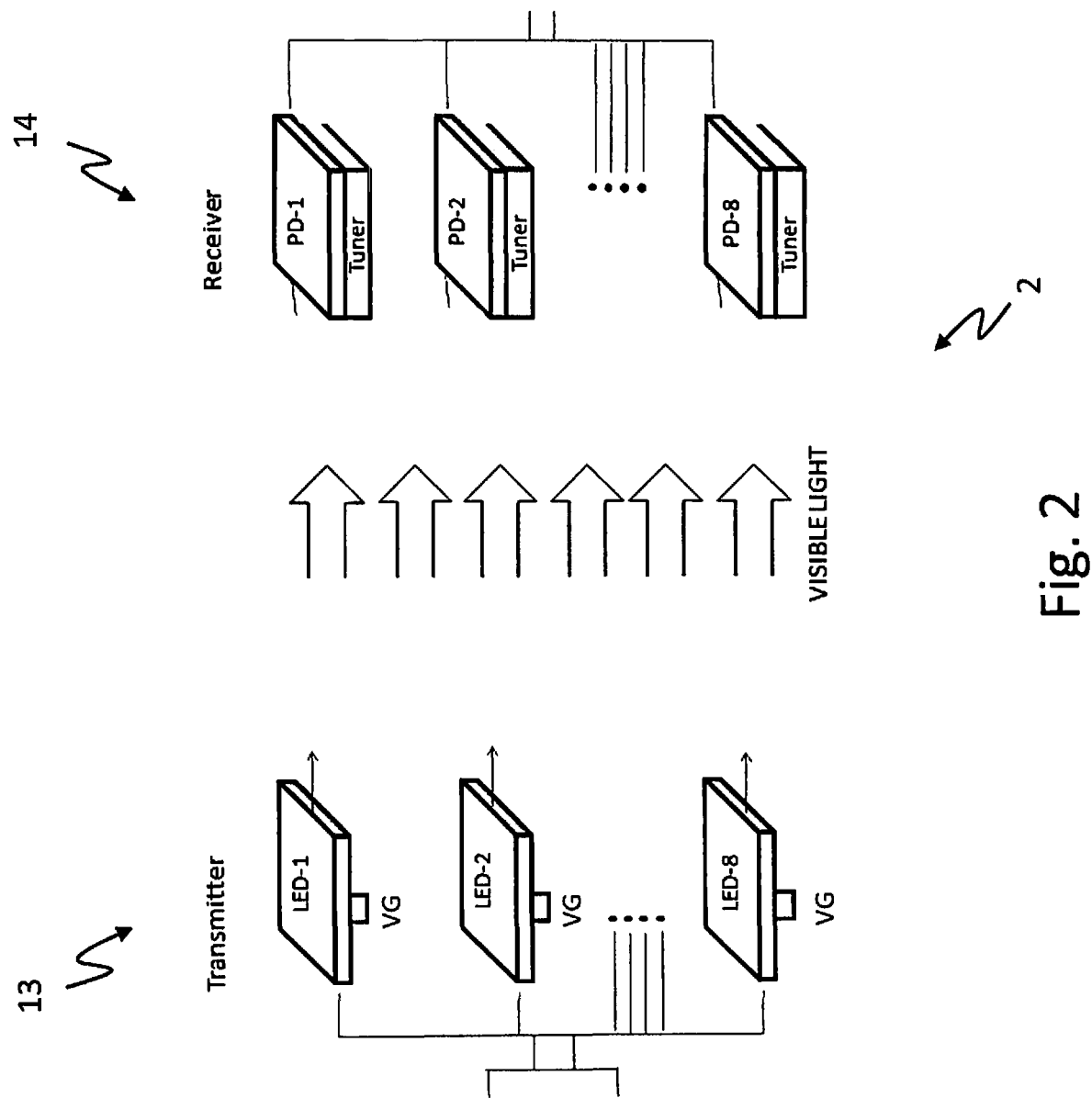
FIG. 2 schematically shows elements of an embodiment of a visible light communication system for colour shift keying.

FIG. 1A schematically shows elements of a prior art visible light communication system 1 for colour shift keying. The visible light communication system 1 comprises a transmitter 3 and a receiver 4. The transmitter 3 comprises a plurality of light emitting diodes (LEDs), which may be three, in which case the system is known as a tri-LED or T-LED system, or four, in which case the system is known as a quad-LED or Q-LED system. Light is emitted by each one of the light emitting diodes at respective peak transmission wavelengths, as represented by the smooth curves in the graph of FIG. 1A, which plots the output power of the LEDs against wavelength, A. These peak transmission wavelengths represent the base colours of a colour constellation, which may be a red-green-blue (RGB) colour space, for example. However, since visible light is emitted by the LEDs at only three or four peak wavelengths, light of any other colour than defined by the peak wavelengths can only be obtained by mixing light from the three or four LEDs. This is inefficient for colour generation, since the power of at least two LEDs must be used to generate such a mixed colour. Moreover, since there are only three or four LEDs in total, this also restricts the range of different colours, which can be obtained by mixing the base colours, and therefore provides only a limited number of symbols which can be encoded using colour shift keying.

The receiver 4 comprises a plurality of photodetectors 6 and a demodulator 8. Each photodetector 6 is provided with a colour filter, which defines a waveband corresponding to one of the peak transmission wavelengths of the light emitted by the light emitting diodes of the transmitter 3. These defined wavebands are represented by the square functions in the graph of FIG. 1A. Thus each of the photodetectors 6 can only receive light emitted by one of the plurality of LEDs. The photodetectors each generate an electrical signal in response to receiving light in the respective one of the defined wavebands. The electrical signals generated by all of the photodetectors 6 are then passed to the demodulator 8, which decodes these electrical signals to derive information encoded in the light emitted by the light emitting diodes of the transmitter 3 using colour shift keying. However, the photodetectors 6 are generally able to detect visible light across a wide spectrum of wavelengths, so filtering is necessary to match the reception waveband of each photodetector to the peak transmission wavelength of each LED in the transmitter. This deliberate reduction in the receptivity of the photodetectors 6 across the spectrum of visible light is inefficient, and leads to an increased signal-to-noise ratio.

FIG. 1B is an International Commission on Illumination (CIE) 1931 x-y chromaticity chart for an example of a tri-LED (T-LED) colour constellation, in other words, when the visible light communication system 1 of FIG. 1A has three LEDs, the colours of which are represented by the filled circles labelled LED-1, LED-2 and LED-3 in FIG. 1B.

In contrast to FIG. 1B, FIG. 1C is a CIE 1931 x-y chromaticity chart for an example of a quad-LED (Q-LED) colour constellation, in other words, when the visible light communication system 1 of FIG. 1A has four LEDs, the colours of which are represented by the labels LED-1, LED-2, LED-3 and LED-4 in FIG. 1C.

FIG. 1D is CIE 1931 x-y chromaticity chart schematically showing some examples of colours generated by mixing light from the Q-LED colour constellation of FIG. 1C. In FIG. 1C, the filled circles 10 represent the four base colours of the Q-LED colour constellation and the filled circles 12 represent colours obtained by mixing these four base colours. A similar CIE 1931 x-y chromaticity chart as that of FIG. 1D could be constructed for the T-LED colour constellation shown in FIG. 1B.

FIG. 2 schematically shows elements of an embodiment of a visible light communication system 2 for colour shift keying. The visible light communication system 2 comprises a transmitter 13 and a receiver 14. The transmitter 13 comprises at least six graphene-based light emitting devices, labelled LED-1, LED-2, . . . LED-8 in FIG. 2. Each of the graphene-based light emitting devices has a different peak transmission wavelength from each other. The graphene-based light emitting devices each comprise a field effect light emitting diode, and the peak transmission wavelength of each such device is tunable to a different wavelength. Each graphene-based light emitting device has associated with it a respective gate voltage tuner, labelled VG in FIG. 2, which is operable to tune the peak transmission wavelength of its graphene-based light emitting device to a different wavelength from the other such devices, using gate voltage tuning. The graphene-based light emitting devices are all connected to a modulator, which is operable to switch selected ones of them on and off to encode information using colour shift keying. Since there are at least six graphene-based light emitting devices, all of which have different peak transmission wavelengths from each other, a wider range of base colours is created thereby, which allows some of these base colours, each of which is generated by only a single one of the graphene-based light emitting devices to replace a one of the corresponding mixed colours generated by a illuminating a combination of LEDs in the prior art system shown in FIG. 1A. The wider range of base colours is also more efficient in generating other mixed colours and allows for a larger number of possible mixed colours in comparison to the prior art system shown in FIG. 1A.

The receiver 14 comprises at least six graphene-based photodetectors, labelled PD-1, PD-2, . . . PD-8 in FIG. 2, having different peak reception wavelengths from each other. The graphene-based photodetectors each comprise a phototransistor comprising a pair of stacked graphene monolayers. The peak reception wavelength of each such photodetector is adjusted to a different wavelength, and each graphene-based photodetector has associated with it a respective tuner comprising a different plasmonic nanostructure in each one, which is configured to adjust the peak reception wavelength of its photodetector to a different wavelength from the other photodetectors. The graphene-based photodetectors are all connected to a demodulator, which is operable to decode information encoded in an electrical signal output by the graphene-based photodetectors as a result of them receiving visible light in which the information was encoded using colour shift keying.

Each respective one of the different peak reception wavelengths of the at least six graphene-based photodetectors PD-1, PD-2, PD-8 in the receiver 14 corresponds to a respective one of the different peak transmission wavelengths of the at least six graphene-based light emitting devices LED-1, LED-2, . . . LED-8 in the transmitter 13.

Since the peak reception wavelengths of the photodetectors are matched to the peak transmission wavelengths of the graphene-based light emitting devices in this fashion, which means that more of the output power from the transmitter is received by the receiver than in the prior art system shown in FIG. 1A, leading to better and more efficient detection and a reduced signal-to-noise ratio.

FIG. 3A schematically shows the graphene-based light emitting devices of the visible light communication transmitter 13 together with a graph schematically representing their associated power outputs. As may be seen from the graph of FIG. 3A, six, seven or eight different base colours may be generated by six, seven or eight such graphene-based light emitting devices within the spectrum of visible light. This larger number of light emitting devices than in a traditional visible light communication system gives a more power efficient colour basis and also allows more colours to be generated by mixing of the base colours than in a traditional T-LED or Q-LED colour shift keying system, which uses a colour constellation of only three or four base colours, respectively.

FIG. 3B schematically shows some of the graphene-based photodetectors of the visible light communication receiver 14 together with a graph schematically representing their associated responsivity overlaid on the power outputs of the graphene-based light emitting devices shown in the graph of FIG. 3A. As may be seen from the graph of FIG. 3B, the ability to adjust the peak reception wavelengths of the graphene-based photodetectors to match the peak transmission wavelengths of the graphene-based light emitting devices allows the graphene-based photodetectors to be used, leading to better and more efficient detection of the visible light output by the graphene-based light emitting devices.

FIG. 3C is a CIE 1931 x-y chromaticity chart schematically showing an example of a colour constellation with eight basic colours for use in a method of colour shift keying, which at least comprises using a colour constellation of at least six base colours. Such a method may be practised using a visible light communication system such as that shown in FIG. 2, for example. In FIG. 3C, the filled circles 10 represent the eight base colours of the colour constellation and the filled circles 12 represent colours obtained by mixing these eight base colours. Using more base colours than in prior art colour constellations, such as those shown in FIGS. 1B and 1C, gives more efficient symbol colour generation, allows a wider range of symbols to be encoded, and gives a lower signal-to-noise ratio.

In summary, therefore, the present disclosure provides a visible light communication transmitter, a visible light communication receiver, a visible light communication system, and a method of visible light communication, wherein the transmitter, the receiver, the system and the method are suitable for colour shift keying (CSK), as well as providing a method of colour shift keying. The visible light communication transmitter comprises at least six, preferably seven, and more preferably eight, graphene-based light emitting devices of different peak transmission wavelengths from each other. The visible light communication receiver comprises a corresponding number of graphene-based photodetectors of different peak reception wavelengths from each other. A visible light communication system according to the disclosure comprises such a transmitter and such a receiver, wherein each respective one of the different peak reception wavelengths of the six graphene-based photodetectors corresponds to a respective one of the different peak transmission wavelengths of the graphene-based light emitting devices. Such a system allows a method of visible light communication, preferably using colour shift keying, with a colour constellation of at least six, maybe seven, or even eight base colours. These can provide an increased number of symbols, a reduced symbol error rate and an improved signal-to-noise ratio in comparison to traditional visible light communication systems for colour shift keying, which use a colour constellation of only three or four base colours.

| Reference Numerals: | |
|---|---|
| 1 | Prior art visible light communication system |
| 2 | Embodiment of visible light communication system |
| 3 | Transmitter |
| 4 | Receiver |
| 6 | Photodetector |
| 8 | Demodulator |
| 10 | Base colour |
| 12 | Colour generated by mixing base colours |
| 13 | Transmitter |
| 14 | Receiver |
| LED-1, LED-2, . . . LED-8 | Graphene-based light emitting devices |
| PD1, PD2, . . . PD-8 | Graphene-based photodetectors |

The invention claimed is:

1. A visible light communication receiver for color shift keying, comprising:
   at least six graphene-based photodetectors of different peak reception wavelengths from each other for use in color shift keying;
   wherein at least one of the graphene-based photodetectors comprises a phototransistor at least comprising a pair of stacked graphene monolayers.

2. The visible light communication receiver according to claim 1, wherein the peak reception wavelength of at least one of the graphene-based photodetectors is adjustable.

3. The visible light communication receiver according to claim 2, further comprising at least one respective tuner associated with the at least one of the graphene-based photodetectors, the tuner comprising a plasmonic nanostructure having a plasmon resonance frequency configured to adjust the peak reception wavelength of the graphene-based photodetector.

4. The visible light communication receiver according to claim 1, further comprising a demodulator operable to decode information encoded in an electrical signal output by the graphene-based photodetectors as a result of them receiving visible light in which the information was encoded using color shift keying.

5. The visible light communication receiver according to claim 1, wherein the at least six graphene-based photodetectors comprise seven graphene-based photodetectors.

6. The visible light communication receiver according to claim 1, wherein the at least six graphene-based photodetectors comprise eight graphene-based photodetectors.

7. A method of visible light communication using color-shift keying, the method comprising:
   transmitting visible light of at least six different wavelengths from respective ones of at least six graphene-based light emitting devices, each of which has a respective peak transmission wavelength different from that of the other such devices; and
   receiving the visible light of at least six different wavelengths at respective ones of at least six graphene-based photodetectors, each of which has a respective peak reception wavelength corresponding to a respective one of the peak transmission wavelengths of the at least six graphene-based light emitting devices, wherein at least one of the graphene-based photodetectors comprises a phototransistor at least comprising a pair of stacked graphene monolayers;

modulating the visible light of at least six different wavelengths before its transmission using color shift keying to encode information;

demodulating an electrical signal output by the graphene-based photodetectors to decode the information encoded in the visible light using color shift keying and received by the graphene-based photodetectors; and tuning the peak transmission wavelength of at least one of the graphene-based light emitting devices using gate voltage tuning.

8. The method according to claim 7, further comprising:
adjusting the peak reception wavelength of at least one of the graphene-based photodetectors using a plasmonic nanostructure.

9. The method according to claim 7, comprising using a color constellation of at least seven base colors.

10. The method according to claim 7, wherein the method is performed using a color constellation of at least six base colors.

11. The method according to claim 7, wherein the method is performed using a color constellation of eight base colors.

12. The method according to claim 7, wherein at least one of the graphene-based light emitting devices comprises a field effect light emitting diode.

* * * * *

UNITED STATES PATENT AND TRADEMARK OFFICE
CERTIFICATE OF CORRECTION

| | |
|---|---|
| PATENT NO. | : 10,951,311 B2 |
| APPLICATION NO. | : 16/473097 |
| DATED | : March 16, 2021 |
| INVENTOR(S) | : Burhan Gulbahar et al. |

It is certified that error appears in the above-identified patent and that said Letters Patent is hereby corrected as shown below:

On the Title Page

Delete:
"(71) Applicant: VESTEL ELEKTRONIK SANAYI VE TICARET A.S. Manisa (TR)", and
Insert:
--(71) Applicant: VESTEL ELEKTRONIK SANAYI VE TICARET A.S., Manisa (TR); OZYEGIN UNIVERSITESI, Istanbul (TR)--

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*